United States Patent [19]

Dubs

[11] Patent Number: 5,738,729
[45] Date of Patent: Apr. 14, 1998

[54] COATING CHAMBER, ACCOMPANYING SUBSTRATE CARRIER, VACUUM EVAPORATION AND COATING METHOD

[75] Inventor: Martin Dubs, Maienfeld, Switzerland

[73] Assignee: Balzers Aktiengesellschaft, Furstentum, Liechtenstein

[21] Appl. No.: 588,394

[22] Filed: Jan. 17, 1996

[30] Foreign Application Priority Data

Nov. 13, 1995 [CH] Switzerland .............. 3204/95

[51] Int. Cl.$^6$ ................................ C23C 14/00
[52] U.S. Cl. .................. 118/726; 118/728; 118/729; 118/730; 118/500
[58] Field of Search ............... 118/718, 728, 118/729, 730, 500, 726

[56] References Cited

U.S. PATENT DOCUMENTS

| | | | |
|---|---|---|---|
| 3,253,945 | 5/1966 | Cauley | 118/718 |
| 3,362,848 | 1/1968 | Hamilton | 118/718 |
| 3,660,146 | 5/1972 | Chadsey | 118/718 |
| 3,683,847 | 8/1972 | Carleton | 118/718 |
| 3,850,138 | 11/1974 | Patono | |
| 4,979,468 | 12/1990 | Kleyer | 118/726 |
| 5,122,389 | 6/1992 | Yasunaga | 118/726 |
| 5,216,742 | 6/1993 | Krug | 118/726 |
| 5,272,298 | 12/1993 | Taguchi | 118/726 |

FOREIGN PATENT DOCUMENTS

| | | |
|---|---|---|
| 60-187676 | 9/1985 | Japan . |
| 1292645 | 11/1989 | Japan . |
| 3072073 | 3/1991 | Japan . |
| 4157160 | 5/1992 | Japan . |
| 1079050 | 8/1967 | United Kingdom . |
| 9511517 | 4/1995 | WIPO . |

Primary Examiner—Richard Bueker
Attorney, Agent, or Firm—Notaro & Michalos PC

[57] ABSTRACT

In order to maintain a required minimal variation of angle of incidence (a) of a coating material on a flat substrate (3), it is recommended that the substrate (3) be exposed to the evaporation source (1) clamped in a curved position.

10 Claims, 5 Drawing Sheets

$$l_0 = \frac{b}{2} \cot g \Delta\alpha$$

$$= \frac{b}{2} \cot g \alpha_2$$

$$l_0 = (a^2 + b^2)^{1/2} \cotg \Delta\alpha \quad (1)$$
$$= (a^2 + b^2)^{1/2} \cotg \alpha_1$$

$$l_0 = \frac{b}{2} \cotg \Delta\alpha$$
$$= \frac{b}{2} \cotg \alpha_2$$

COATING CHAMBER, ACCOMPANYING SUBSTRATE CARRIER, VACUUM EVAPORATION AND COATING METHOD

FIELD AND BACKGROUND OF THE INVENTION

The invention here presented concerns a coating chamber, an accompanying substrate carrier for it, a method for the vacuum coating of a flat substrate, applications thereof as well as a general coating method.

On the one hand, the invention relates to the aforementioned chamber, substrate carrier and method for the vacuum coating of substrates, whereby a reactive or non-reactive evaporation using an electron beam evaporator, a spark evaporator, or by means of thermal crucible evaporation is understood, however, it is especially directed toward reactive or non-reactive evaporation by means of thermal crucible evaporation, and preferably by means of electron beam evaporation.

In a more general way, however, the invention here presented also relates to influencing the distribution of the layer thickness in other coating processes, as in the case of sputter coating.

On the basis of FIG. 1 the known method of evaporation-coating of a flat substrate with it's drawbacks should be discussed and, in addition, the following dimensions be defined.

An evaporation source 1 in a vacuum chamber, whether it be an electron beam evaporator or a thermal crucible evaporator, can be viewed as a source-point more closely as source at point P, defined through the base-point of the central axis A of the new surface of the material to be evaporated.

Infinitesimally small reference-surfaces ΔF can be observed on a flat substrate distanced from base-point P.

Definitions

Angle of incidence α is understood to be the angle between the perpendicular n, on the reference-surface F and the connecting-line l between the base-point of the aforementioned perpendicular and point P at the source.

The angle of incidence α varies on a flat substrate depending on the position of the surface-element ΔF being viewed. The angle of incidence of the surface-element $\Delta F_o$ in the center of the substrate is marked as the central angle of incidence.

Maximum Deviation of Angle of Incidence

This is understood as being the difference Δα from the minimal angle of incidence and maximum angle of incidence α on an observed substrate/source-configuration Specific Rate of Coating This is understood to be the amount of material deposited on an observed surface-element ΔF per unit of time. It is inversely proportional depending on the square of the length of the straight line l and, according to FIG. 1, thereby varies greatly with the position of the observed surface-element. It is further dependant upon the characteristic K of the source—here approximated as a spherical characteristic—as well as from the angle of incidence α.

Coating Efficiency

This is understood to be the relationship between the total amount of material deposited on substrate 3 per unit of time and the amount of material vaporised at the source 1 per unit of time. This varies squarely with $1/lo^2$, whereby, according to FIG. 1, lo corresponds to the mean distance between substrate 3 and point P.

At present, there exists the need to vapour-coat ever greater flat substrates.

It is often necessary to make sure that the variation of the angle of incidence Δα along the substrate does not exceed a predetermined angle.

This is the case, for example (s. WO 95/11517), and especially so, in connection with the production of so-called Field Emission Displays (FED). With increasing coating time, under suitable coating conditions, cylindrical indentations are closed gradually by the coating material, and on the floor of these indentations sharp cones form, on which the required field emission is possible. When a defined, maximum tolerable deviation angle of impact $\Delta\alpha_{max}$ is not held to along the entire substrate, then the uniform growth of these cones along the substrate is disturbed, which impairs the quality of the display and can even lead to it's becoming unusable. In this case, according to FIG. 1, α is selected as zero.

FIG. 1 shows a rectangular-shaped substrate with the dimension a×b which is to be coated by evaporation. By choosing a minimal mean distance lo to be held to, it is possible to make sure that a maximum predetermined deviation of angle of incidence is maintained. If, according to FIG. 1, $\alpha_o=0$ is selected for substrate 3 and $\Delta F_o$ is prescribed at the piercing point of axis A and a maximum deviation of angle of incident $\Delta\alpha_{max}$ is prescribed, then the result is that the minimal mean distance is lo $$lo = 1/2 (a^2+b^2)^{1/2} \cdot cotg\Delta\alpha max \qquad (1)$$
$$= 1/2 (a^2+b^2)^{1/2} \cdot cotg\, \alpha_1 \qquad ,$$

whereby in the special case of centralized substrates $\Delta\alpha_{max}$ under consideration, the angle of incidence at the surface-element ΔF, which, according to FIG. 1 is farthest away from substrate center $\Delta F_o$, must correspond to the angle of incidence $\alpha_1$.

If, for example, substrate 3 stretches across a size of 300 mm×400 mm and a maximum angle deviation $\Delta\alpha_{max}$ of 7° is exacted, as for example in the manufacture of FED, the result is, according to (1), a minimal distance to be maintained lo of 2000 mm.

Thereby, the following drawbacks of the known method, which is schematically depicted in FIG. 1, are obvious:

a) Extraordinary large coating chambers are necessary which require long conditioning times, and especially long evacuation times, whereby the process-time becomes unacceptably long. This means, from a construction point of view, that such chambers are costly.

b) The specific rate of coating varies when maintaining the maximum tolerable $\Delta\alpha_{max}$ because of the square relationship to the surface element/source distance l.

c) Because of the large source to substrate mean distance lo, the degree of coating efficiency is rather poor.

SUMMARY OF THE INVENTION

It is the object of this invention here presented to resolve the drawbacks of such a coating chamber as well as a method of the kind mentioned at the outset.

The following solution of this proposition presented results in the general possibility to influence in an inventive way the rate of coating distribution, and/or, the angle of incidence along a substrate, and to do this not only in an evaporation method.

The aforementioned object is resolved by means of the coating chamber of the kind mentioned at the outset, which follows the claimed invention, and/or through the provision of a substrate carrier according to the invention, and further through the method mentioned at the outset and which follows the inventive method. This is not only in the case of coating processes, in which at substrate 3 a central angle-of-impact $\alpha_o=0°$ appears, and/or the source-axis A runs through the substrate center $\Delta F_o$, but also by the layout, in which $\alpha_o \neq 0$ is and/or A does not pierce the center $\Delta F_o$, as can be the case, for example, when several flat substrates are lined-up opposite the source on the periphery of a substrate-carrier's calotte or a main carrier, which rotate around it's central axis.

Thereby, the invention is achievable and in certain cases advantageous, in such layouts in which the substrates are arranged on planetary-carriers which on the one hand rotate around the planetary-axis, and the planets themselves are rotated around the system-axis. In this way, the distribution of the layer thickness over the substrate, when compared with planet-carrier layouts without the application of the present invention, is much improved. The planetary layout of the substrate is especially advantageous for a simultaneous coating of several substrates, and in addition, the degree of coating efficiency is improved.

With consideration if large substrates have to be coated, applications corresponding to other features of the invention preferred.

BRIEF DESCRIPTION OF THE DRAWINGS

The invention is subsequently illustrated with appended diagrams.

Figure 1:
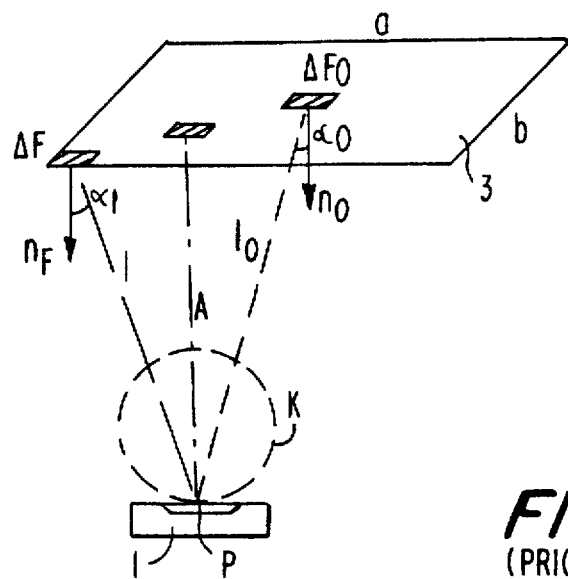
FIG. 1 is a schematic illustration of a rectangular substrate and a source with various parameters known in the prior art.
Figure 2:
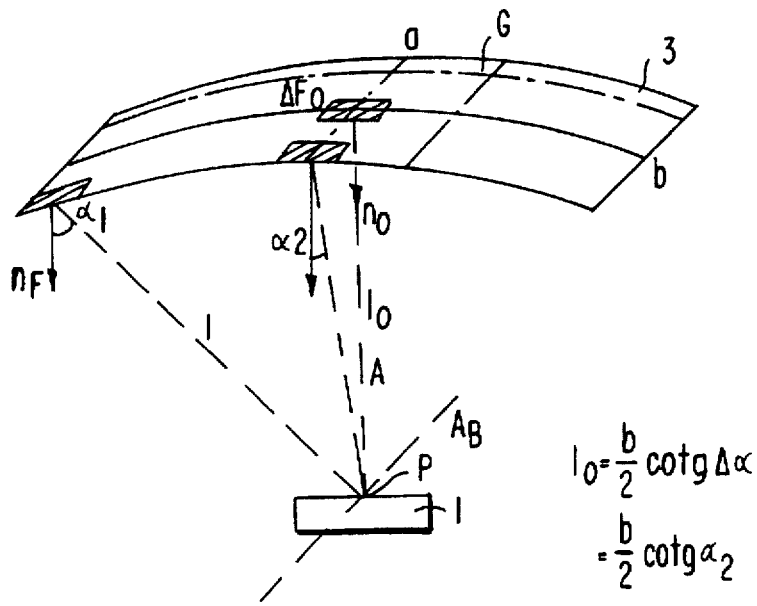
Figure 3A:
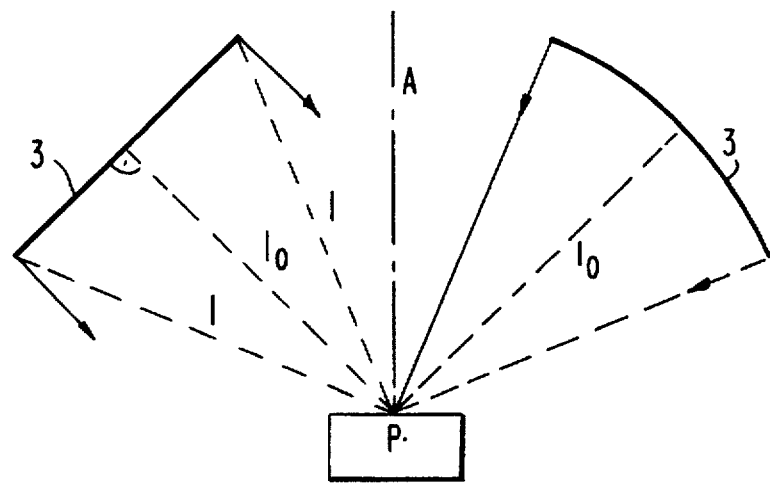
Figure 3B:
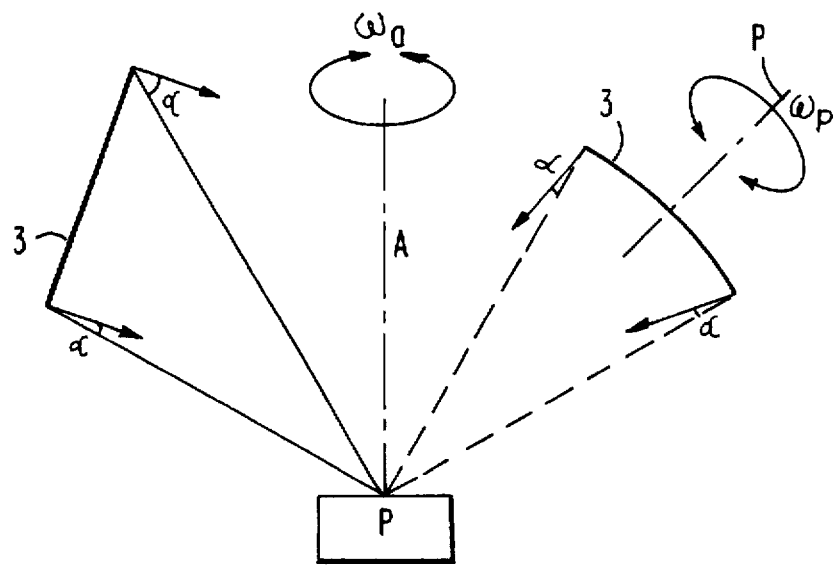
Figure 5:
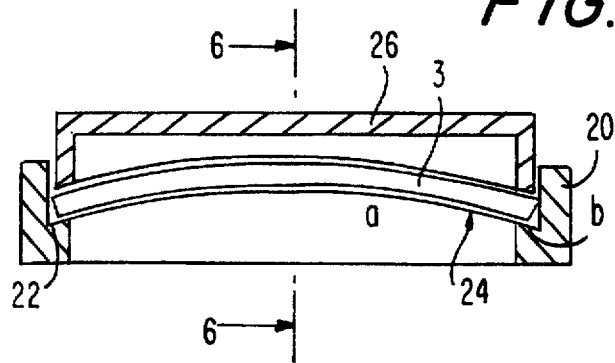
Figure 6:
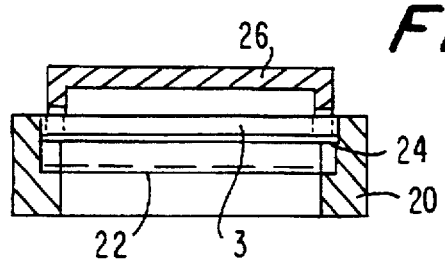
Figure 7:
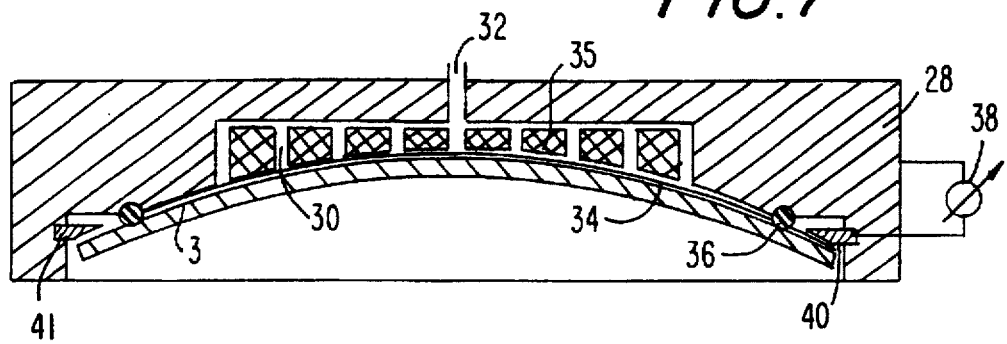
Figure 8:
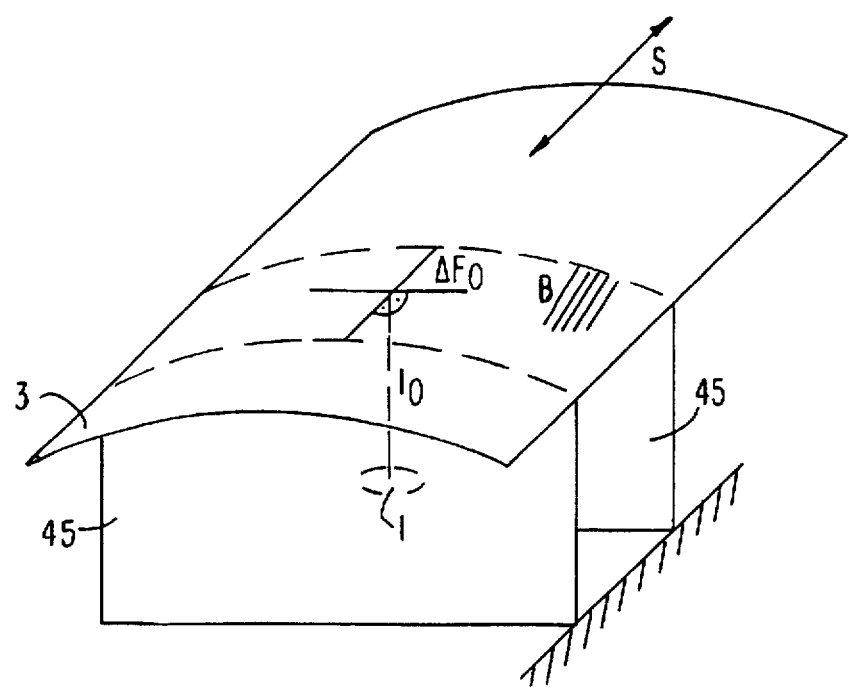

They show:

FIG. 2 proceeding from FIG. 1, FIG. 2 shows the special case of a substrate centralized over the source-axis A with $\alpha_o=0$, schematic, the selected method on a chamber according to the invention, it's respective substrate carrier, and the method according to the invention;

FIGS. 3a and 3b respectively share proceeding from a projection corresponding to FIGS. 1 and 2, the method in general cases, where one or more substrates are not centered relative to axis A, or where $\alpha_o=0$ is not maintained. Also indicated is the rotation of the substrate with $\omega_a$ and or $\omega_p$;

FIGS. 4a to 4d schematically illustrate, various possibilities for the construction of a substrate-carrier according to the invention;

FIG. 5 in a cross-sectional schematic view of, a preferred design-form of a substrate-carrier according to the invention, especially for rectangular or square substrates;

FIG. 6 in projection analog to FIG. 5, is a cross-section representation corresponding to line 6—6 of FIG. 5;

FIG. 7 a further is a schematic view of design-form of a substrate-carrier according to the invention;

FIG. 8 schematic, the procedure of the linear transport of a curved substrate according to the invention over one or more sources with the provision of a collimator.

DESCRIPTION OF THE PREFERRED EMBODIMENTS

According to FIG. 2, according to the invention, substrate 3 is centered in relation to axis A and curved with $\alpha_o=0$, and in this regard with at least a minimal bending axis $A_B$, which preferably runs through the base-point P of source 1. Preferably it lies parallel to the smallest diameter of the substrate, that is to say, according to FIG. 2, parallel to the smaller rectangular side b. As can be clearly seen, the variation of the angle of incidence $\Delta\alpha$ on substrate 3 is generally reduced through the curvature according to the invention; if the neutral-axis $A_B$ really lies, as preferred, at the base-point P, then the bending radius in the special case under observation is chosen as lo. Surface elements $\Delta F$ along the major circumferential lines, according to G, of the cylindrically curved substrate 3, all have the same angle of incidence $\alpha$. The largest deviation of angle of incidence $\Delta\alpha$ appears along the surface line L of the cylinder surface. If further, as in the case if FIG. 1, the maximum tolerable variation of angle of incidence $\Delta\alpha_{max}$ is prescribed as $F_o$, then in the case of a×b=300×400 mm, the minimal distance to be held to, lo, shows $$lo = (b/2) \cdot \cot g \Delta\alpha_{max} \qquad (2)$$
$$= (b/2) \cdot \cot g\alpha_2.$$

The minimal distance to be held to, lo, now shows as 1222 mm, which corresponds to a reduction of 40% using the method according to the invention. Thereby, A) the necessary coating-chambers are decidedly smaller, B) the specific rate of substrate coating is fundamentally more homogeneously distributed, C) the degree of coating efficiency is fundamentally improved.

On the basis of observing FIG. 2, the person skilled in the art can see immediately that a further reduction and improvement in the sense of the above-mentioned is attained, when the substrate 3 is not cylindrically curved around a bending axis $A_B$, but rather, spherically curved, preferably around point P.

With reference to how the bending radius as well as the cylindrical or spherical curvature is processed in this particular case, depends among other things on the elasticity of the substrate along with it's material and it's dimensions, taking into consideration that the substrate should not show any evidence of lasting deformation.

In view of the above-mentioned special cases it is discernible that, when the central surface element $\Delta F_o$ shows a surface perpendicular $n_o$ which runs through P and lies in A, with reference to the deviation of the angle of incidence $\Delta\alpha$ at the substrate symmetrical proportions always prevail.

If however the substrate with $\alpha_o=0$ is eccentrically lined-up with regard to A, as schematically projected in FIGS. 3a and 3b on the left, here also, with the curvature according to the invention (projected on the right) whether it be cylindrical or spherical, the remaining deviation of angle of incidence $\Delta\alpha$ is reduced to 0, which here also allows a reduction of the source to substrate mean distance lo.

If in addition, according to FIG. 3b, the layout of the flat substrate is chosen with regard to source point P, so that $\alpha_o \neq 0$, then once again, through the curvature according to the invention as projected in FIG. 3b, the desired reduction of $\Delta\alpha$ according to the invention is attained.

Because in every case the minimal distance to be maintained between substrate 3 and source point P is reduced with the given tolerable $\Delta\alpha_{max}$ through the method according to the invention, so too the result with calotte carriers is a determined reduction in the volume of the coating chamber. This is also accompanied by an improved coating efficiency.

Because further, as can be readily deduced from FIGS. 2 to 3, the distance proportions l between the surface elements $\Delta F$ and source point P allow themselves to be fundamentally changed by means of a curvature according to the invention, this results in the further possibility by means of the method according to the invention of fundamentally adjusting the rate of coating distribution on the substrate, that is to say, by means of a targeted, applied curvature of the substrate, which, if necessary, is also variable during a process. This applies also for coating methods in which the source can be much less observed as being point like, as for example in the method of sputter-coating.

Figure 4A:
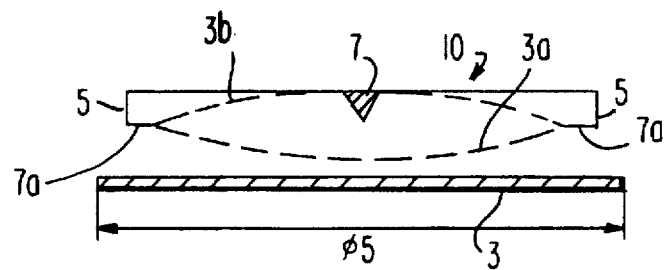

In FIG. 4a, a first implementation of a substrate carrier 10 according to the invention is schematically projected. It shows the contact-sections 5 for the edge of the flat substrate 3, which face each other across a distance, which distance is less than the diameter $Ø_s$ of the substrate 3 to be clamped. When inserting substrate 3a, a convex outwards curvature of substrate 3, as projected by 3a, can be obtained, if desired, through the provision of a middle mandrel 7. If preferred, by providing fixed marginal stops 7a and without the middle mandrel 7, a concave inwards curvature of the substrate, according to 3b, can be obtained.

Figure 4B:
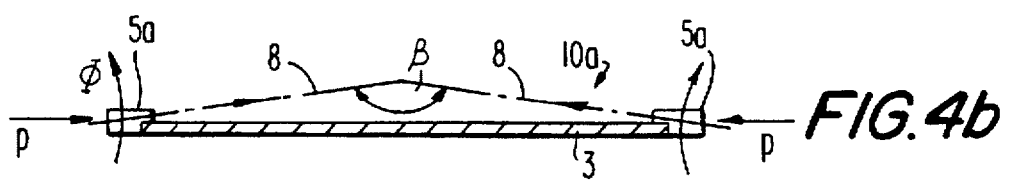
Figure 4C:
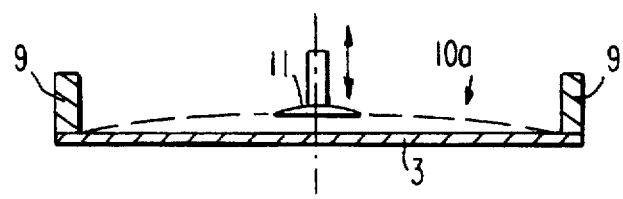
Figure 4D:
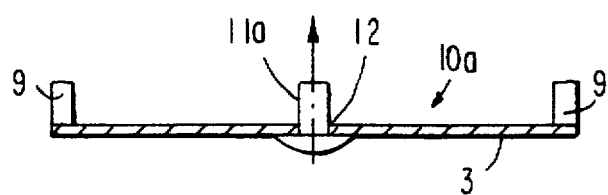

In FIGS. 4b, 4c and 4d, some example implementations of a substrate carrier 10a according to the invention are schematically projected, on which movable tensioning bodies relative to one another for the bending of the substrate are provided.

According to FIG. 4b, the contact-sections 5 on the substrate carrier 10a are movable in relation to each other. They are, either, with at least one moving component P moveable against one another, for example along motion tracks 8, which enclose an obtuse-angle β, in order to curve into a convex the still flat substrate as projected in FIG. 4b, or, they are horizontally-pivotable, both if necessary, as projected by Φ, in order to achieve this curvature.

According to FIG. 4c, the substrate is supported in at least two periphery-areas facing one-another, by means of supporting bodies 9, and then a traction-body engages in the middle of the substrate in order to curve it in a preferably concave manner, as marked with dashed lines in the projection.

The last implementation is especially suitable for the curvature of a circular disk-shaped substrate with a central opening according to FIG. 4d where the traction-body 11a engages through the central opening 12 of the circular disk-shaped substrate 3, the latter at the periphery, for example, touching on the circular ring surface of the support 9, and which substrate is curved into a calotte-shape by the action of pulling the body 11a upwards.

In FIG. 3b at the right, the realization of the present invention on planetary substrate carriers is schematically projected. Thereby, the substrates 3, indicated by $ω_p$, are turned around the respective planetary axes P, and the planets with the substrates 3, indicated by $ω_a$, are turned around the set-up, that is to say, the calotte-axis A.

In FIGS. 5 and 6, an implementation of a substrate carrier according to the invention preferred nowadays is projected, one especially for rectangular shapes, respectively square substrates. The substrate carrier comprises of a an external, rectangular frame 20 which exhibits inclined supporting surfaces along it's opposing inner surfaces, preferably the shorter, corresponding side b in FIG. 2.

According to FIG. 6, it is considered preferable that the supporting surfaces 24 on the longer frame sides are not inclined, preferably curved according to the view in FIG. 5, which, corresponding to the maximum substrate curvature to be produced are worked into the frame piece. The rectangular-shaped substrate 3 is placed curved onto the surfaces 22 to 24 respectively, and there, curved, it is by means of a clamp 26, also frame-like as pictured in the projection, clamped.

Thereby, the substrates for handling are at least already put into the outer frame 20, if necessary already clamped with the clamping-frame 26, in order to avoid damage and in order to avoid every kind of contamination in the treatment chamber through abrasive particles whilst putting the substrates 3 into the carrier.

Naturally, if desired, the analog carrier-arrangement for the convex, outward going curvature of the substrate can be realised.

On the basis of the substrate carrier according to the invention just described, it was explained how a mechanically curved substrate 3 could be admitted.

In FIG. 7, a further substrate carrier according to the invention is schematically projected, by means of which the substrate is held curved electro-magnetically and by means of a vacuum pulled into the required bending position. In this case also it is preferable that the substrate be arranged on the substrate outside of the vacuum coating chamber.

The carrier 28 comprises again of a frame with a curved inner retaining surface 35 for the substrate 3. On the retaining surface 35, suction channels 30 flow out in a shower fashion, which together with a suction connection 32 communicate on behalf of a vacuum pump. An insulating coating 34 covers the supporting surface for the curved substrate 3. After placing a still flat substrate 3 onto the circumferential seal 36 it is pulled tightly onto the supporting surface 35 by means of the suction of the suction channels 30. There is a direct current set up between the electrically conducting substrate 3, or at least it's electrically conducting surface coating, and the carrier 28, for example, by means of a contact ring 40, represented by 41 on the remaining carrier 28, electrically isolated, by means of a switch and preferably adjustable supply point 38, whereby, the conducting surface of the substrate 3 is held tightly onto the arched supporting surface 35 of the carrier 28, over the insulating coating 34.

Especially for the spherical curvature of substrates advantage can be taken of the different thermal expansions or the thermal strains of coatings from different substrate materials. To that end, the substrate is formed out of two connected coatings, one on top of the other, with different expansion factors. The generally undesired warping of coated substrates is here, in line with the invention, beneficially taken advantage of. For example, the desired concave deformation is achieved through the use of a coat with a higher thermal expansion factor on the reverse side of the substrate, so that for the following coating on the front side the substrate deforms spherically with higher temperatures and after cooling down takes on the original flat form once more. Thereby the coat on the reverse side of the substrate can be permanently attached or just for the purpose of deformation during the coating of the front side. In order to target the suitable curvature (concave or convex) the thickness of the coat, the materials used and the coating temperature can be suitably chosen.

In FIG. 8, a rectangular substrate is schematically shown, which, as represented by s, is moved linearly over the source 1. By means of blinds 45, preferably symmetric at both sides of source 1, Area B, on the linearly-in-motion substrate 3, is as a collimator separated, which is coated according to the invention. Of course, various sources 1 can be provided in the coating area, and this in a basic way, that is to say, also without linear-motion and without collimator. Through the provision and the corresponding layout of the blinds 45 not only is the now active area of the angle of incidence α determined, but the specific rate of coating utilised can also be determined, and thereby the distribution of the coating thickness, especially also by means of controlling the substrates' rate of feed motion in relation to the area B which is separated by the blinds 45.

On the basis of the aforementioned, many possibilities are opened to the man skilled in the art to curve the substrate cylindrically, dome-shaped, or indeed, to curve only a certain target surface area, on the one hand, in order to reduce the deviation of the angle of incidence $A_{amax}$ to homogenise the coating distribution rate and to improve the coating efficiency, and on the other hand, if necessary, to also attain a target coating distribution rate which does not need to be homogenous.

The various features of novelty which characterize the invention are pointed out with particularity in the claims annexed to and forming a part of this disclosure and are entirely based on the Swiss priority application No. 03 205/95, filed Nov. 13, 1995.

What is claimed is:

1. A coating chamber for at least one initially flat plate-like substrate, comprising: an evaporation source and a substrate carrier spaced from the evaporation source, said substrate carrier including means to bend said initially flat plate-like substrate within limits of elasticity of the initially flat plate-like substrate, to form said initially flat plate-like substrate into a curved substrate having a bent surface and so as to homogenize all incident angles of material evaporated from said evaporation source onto said curved substrate.

2. A coating chamber according to claim 1, characterized in that the substrate carrier (10) tensions the substrate in a concave bend toward the source (1).

3. A coating chamber according to claim 1, characterized in that the substrate carrier (5) is dimensioned in such a way that the substrate can only be taken on bent, or, that clamping bodies (5a) on the substrate carrier which are movable in relation to each other are set up to tension a flat substrate which has been placed in the substrate carrier.

4. A coating chamber according to claim 1, characterized in that the substrate carrier (5a) means comprises fixation bodies for at least two opposing peripheral areas of the substrate, which run on bearings toward and away from each other.

5. A coating chamber according to claim 1, characterized in that the substrate carrier means has an essentially centrally located tensing body (11, 11a) which is central to the substrate, which body is movable perpendicular to the substrate.

6. A coating chamber according to claim 5 for substrates with a central opening, characterized in that the central tensing body (11a) is structured to contact into the substrates' central opening.

7. A coating chamber according to claim 1, characterized in that several substrate carriers are arranged along a main-carrier over the source, that the main-carrier is rotary-driven around an axis and the substrate carriers move as planets around their respective axes (P).

8. A coating chamber according to claim 1, characterized in that the source (1) is arranged between collimator blinds (45) and the substrate carrier is driven over the source and the blinds are linearly movable.

9. A coating chamber according to claim 1, characterized in that tensing bodies (5a, 11) which are mechanically, pneumatically, thermally and/or electrically connected operationally relative to one another, are provided as the means to bend the substrate received on the substrate carrier.

10. A coating chamber according to claim 1, wherein the curved substrate has a central axis which is perpendicular to the bent surface of the substrate, the evaporation source being positioned so that the central axis impinges on the evaporation source.

* * * * *